(12) United States Patent
Motoyoshi

(10) Patent No.: US 6,855,563 B2
(45) Date of Patent: Feb. 15, 2005

(54) METHOD OF MANUFACTURING A TUNNEL MAGNETO-RESISTANCE BASED MAGNETIC MEMORY DEVICE

(75) Inventor: Makoto Motoyoshi, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 10/420,440

(22) Filed: Apr. 22, 2003

(65) Prior Publication Data

US 2004/0014245 A1 Jan. 22, 2004

(30) Foreign Application Priority Data

May 1, 2002 (JP) ........................................ 2002-129509

(51) Int. Cl.[7] .............................................. H01L 21/00
(52) U.S. Cl. .......................... 438/3; 438/253; 438/257; 438/593
(58) Field of Search ............................. 438/3, 257–259

(56) References Cited

U.S. PATENT DOCUMENTS 6,522,573 B2 * 2/2003 Saito et al. .................. 365/158

* cited by examiner

Primary Examiner—Dung A. Le
(74) Attorney, Agent, or Firm—Robert J. Depke; Holland & Knight LLP

(57) ABSTRACT

In a method of manufacturing a magnetic memory device comprising a writing word line (first wiring) and a bit line (second wiring) three-dimensionally orthogonally intersecting therewith, with a TMR device therebetween, a first mask to be a mask shape for the TMR device is formed, the TMR device is formed by use of the first mask as a mask, thereafter a second mask to be used for forming a wiring for connecting the TMR device to a wiring on the lower side thereof is formed while causing at least a part of the second mask to overlap with the first mask so that the first mask becomes a mask at one end side of the wiring, and a connection wiring for connecting the TMR device to the wiring on the lower side thereof is formed by use of the first and second masks.

2 Claims, 7 Drawing Sheets

F I G. 4 A
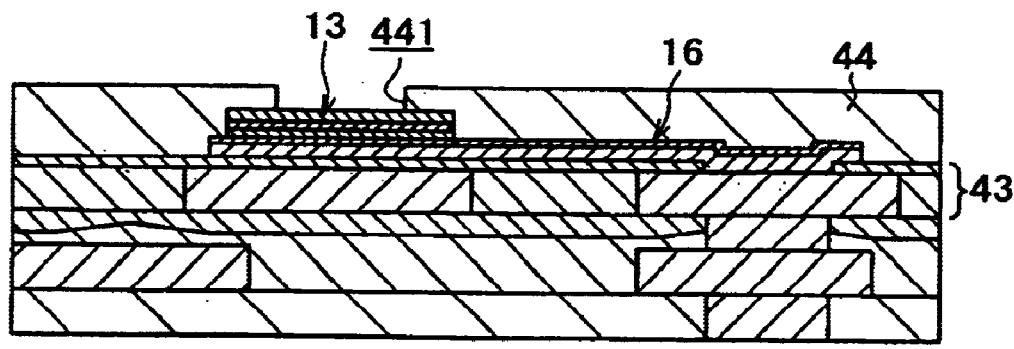
F I G. 4 B
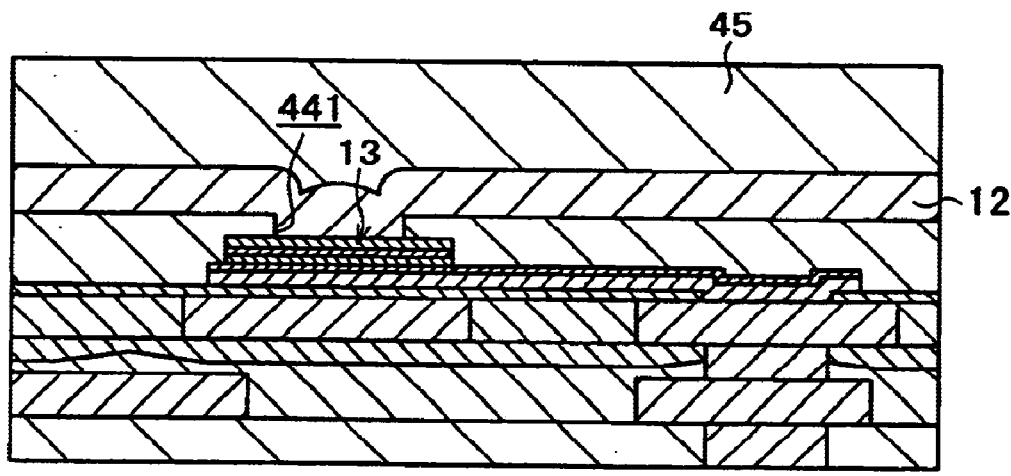

METHOD OF MANUFACTURING A TUNNEL MAGNETO-RESISTANCE BASED MAGNETIC MEMORY DEVICE

This application claims priority to Japanese Patent Application Number JP2002-129509 filed May 1, 2002 which is incorporated herein by reference.

BACKGROUND OF THE INVENTION

The present invention relates to a magnetic memory device and a method of manufacturing the same, and particularly to a method of manufacturing a non-volatile magnetic memory device, and the magnetic memory device, for recording information by utilizing the phenomenon that the resistance of a ferromagnetic material constituting a tunnel magnetoresistance device (hereinafter referred to as TMR device) varies according to whether the spin directions are parallel or antiparallel.

Attendant on the rapid popularization of information communication apparatuses, particularly, personal small apparatuses such as personal digital aids, the devices such as memory devices and logic devices constituting these apparatuses are demanded to have a further higher performance such as higher degree of integration, higher operating speed, and less power consumption. Particularly, non-volatile memories are considered to be indispensable devices for the ubiquitous computing age.

The non-volatile memories can protect important personal data even when, for example, the power source is exhausted or troubled or when a server and a network are disconnected due to some disorder. Accordingly, the enhancement of density and capacity of the non-volatile memories has come to be more and more important as a technology for substitution for hard disk and optical disk drives which cannot intrinsically be reduced in size due to the presence of movable parts.

In addition, while the recent portable apparatuses have been designed to reduce power consumption as much as possible by putting the unnecessary circuit blocks into a stand-by condition, the wasting of power consumption and memories can be precluded if a non-volatile memory functioning as both a high-speed network memory and a high-capacity storage memory is realized. Besides, the so-called instant-ON function for enabling the apparatus to be started instantaneously upon turning-on of the power source can be achieved if a high-speed high-capacity non-volatile memory is realized.

The non-volatile memories conventionally known include the flash memory using a semiconductor and the FRAM (ferroelectric random access memory) using a ferroelectric material. However, the flash memory has the defect of a slow writing speed on the order of microseconds. On the other hand, the FRAM has a number of times of overwriting possible of 1012 to 1014, which means an insufficient durability for perfect substitution for static random access memory and dynamic random access memory. Besides, there has been pointed out the problem that it is difficult to achieve micro-processing of ferroelectric material capacitors.

A memory paid attention to as a non-volatile memory which does not have the above-mentioned drawbacks is the magnetic memory called MRAM (magnetic random access memory). The MRAMs in the beginning stage have been based on spin valves using the AMR (anisotropic magnetoresistance) effect reported in J. M. Daughton, Thin Solid Films, Vol. 216 (1992), pp. 162–168, or the GMR (giant magnetoresistance) effect reported in D. D. Tang et al., IEDM Technical Digest, (1997), pp. 995–997. However, these MRAMs have the drawback that since the memory cell resistance of the load is as low as 10 to 100 Ω, the power consumption per bit at the time of reading is large and it is difficult to achieve a higher capacity.

On the other hand, as for the TMR (tunnel magnetoresistance) effect, there was once the drawback that the resistance variation factor was no more than 1 to 2% at room temperature, as reported in R. Meservey et al., Physics Reports, Vol. 238 (1994), pp. 214–217. In recent years, however, a resistance variation factor of about 20% has come to be achieved, as reported in T. Miyazaki et al., J. Magnetism & Magnetic Material, Vol. 139 (1995), L231, and attention has become focused on the MRAM using the TMR effect.

The MRAM is simple in structure, which allows an easy increase in the degree of integration, and, since recording is conducted by rotation of magnetic moment, it is predicted that the number of time of overwriting possible is large. As to access time in the MRAM, a very high speed is expected, and an operating speed of 100 MHz has already been achieved, as reported in R. Scheuerlein et al., ISSCC Digest of Technical Papers, (February 2000), pp. 128–129.

Next, a method of manufacturing an MRAM according to the related art will be described referring to the manufacturing step sectional views shown in FIGS. 3 and 4. FIGS. 3 and 4 illustrate principally the formation of a tunnel magnetoresistance device and a method of forming a connection wiring for connecting the tunnel magnetoresistance device to a conductor layer provided on the lower side thereof.

As shown in FIG. 3A, a first insulation film 41 for covering a reading transistor (not shown) is formed, and a first contact 31 for connection to a diffusion layer (not shown) of the reading transistor is formed in the first insulation film 41. Further, a sense line 15, a first landing pad 32 for connection to the first contact 31, and the like are formed on the first insulation film 41, and a second insulation film 42 for covering these components is formed. The surface of the second insulation film 42 is planarized by chemical mechanical polishing, and the second insulation film 42 is left in a thickness of 700 nm on the sense line 15 and the first landing pad 32. Furthermore, a mask layer (not shown) composed of a P-SiN film is built up in a thickness of 20 nm.

An insulation film 431 constituting a lower layer of a third insulation film 43 is formed on the mask layer. A writing word line 11 with a groove wiring structure, and a second contact 33 and a second landing pad 34 which are connected to the first landing pad 32 are formed in the insulation film 431. The writing word line 11 and the second landing pad 34 are exposed at the surface of the insulation film 431. An insulation film 432 for covering the writing word line 11 is formed by building up aluminum oxide in a thickness of 50 nm, on the insulation film 431. Thus, the insulation film 431 and the insulation film 432 constitute the third insulation film 43. The insulation film 432 on the second landing pad 34 is provided with a via hole 433 for contriving connection between a TMR device which is to be formed and the second landing pad 34.

A barrier layer (not shown), an antiferromagnetic material layer 131, a magnetization fixed layer 132 formed of a ferromagnetic material, a tunnel insulation layer 133, a storage layer 134 formed of a ferromagnetic material, and a cap layer 135 are sequentially formed in this order from the lower side by PVD (physical vapor deposition), on the third insulation film 43 with the above-mentioned structure inclusive of the via hole 433.

Next, as shown in FIG. 3B, the cap layer 135 is etched by a reactive ion etching technique with a photoresist as a mask, thereafter the photoresist is ashed, and the range from the storage layer 134 to an intermediate portion of the tunnel insulation layer 133 is etched with the cap layer 135 as a mask, to form a TMR device region 14. The finish point of etching is set in the tunnel insulation layer 133. Though not shown, the aluminum oxide film of the tunnel insulation layer 133 is left in other regions than the TMR device region 14. A halogen gas containing chlorine (Cl) (for example, chlorine ($Cl_2$), boron trichloride ($BCl_3$), etc.) or a mixed gas prepared by adding ammonia ($NH_3$) to carbon monoxide (CO) is used as the etching gas. In performing the etching, it is important to set the etching conditions so that the etching is stopped in the thin aluminum oxide film of the tunnel insulation layer 133 by raising the etching selectivity ratio between the storage layer 134 formed of the ferromagnetic material on the tunnel insulation layer 133 and the aluminum oxide of the tunnel insulation layer 133 to a value of not less than 10, or by lowering the etching speed.

Next, as shown in FIG. 3C, the remaining tunnel insulation layer (not shown), the magnetization fixed layer 132 composed of the ferromagnetic material layer as the lower layer, the antiferromagnetic material layer 131, and the barrier layer (not shown in this figure) are etched by a reactive ion etching technique using a photoresist as a mask, and a connection wiring 16 is formed. Thereafter, the resist mask is removed.

Subsequently, as shown in FIG. 4A, a fourth insulation film 44 is formed by building up a silicon oxide film in a thickness of 300 nm on the insulation film 43 so as to cover the TMR device 13, the connection wiring 16 and the like by a plasma CVD method, and thereafter the fourth insulation film 44 is provided with a connection hole 441 reaching the TMR device 13 by dry etching using a photoresist as a mask. In addition, connection holes (omitted in this figure) for connection to lower-layer wirings of peripheral circuits (the same layer as the landing pad for connection between the substrate and the TMR device) are also formed.

Next, as shown in FIG. 4B, a bit line 12 connected to the TMR device 13 through the connection hole 441, the wirings of the peripheral circuits (not shown in this figure), and a bonding pad region (omitted in this figure) are formed by a standard wiring forming technique. Further, a fifth insulation film 45 is formed by building up a plasma silicon nitride film on the whole surface of the fourth insulation film 44 in the manner of covering the bit line 12, and thereafter a bonding pad portion (not shown) is opened, to complete the LSI wafer process.

In this manufacturing method, as shown in FIG. 5, due to the presence of alignment errors between a mask pattern 71 (indicated by two-dotted chain line) for forming the TMR device region and a mask pattern 72 for forming the connection wirings, dimensional dispersions and the like, it is necessary to set the mask pattern 72 to be greater than the mask pattern 71 by $\Delta X=0.07$ to $0.1$ μm so that the surface of the TMR device 13 is not exposed at the time of forming the connection wirings. Even upon designing with a minimum dimension of design rule given to the TMR device, the connection wirings would be greater by two times of the alignment margin (i.e., 0.14 to 0.2 μm). Therefore, the memory cell obtained would be greater by 0.14 to 0.2 μm in the arrangement direction of the writing word lines 11.

In the MRAM cell comprised of one selection device and one TMR device or comprised of two selection devices and two TMR devices, the reduction of the size of the cell is an important factor for raising the degree of integration. As an example, the cell layout of the MRAM comprised of one selection device and one TMR device is shown in FIG. 6.

As shown in FIG. 6, the cell size is derived from the TMR device 13 and the TMR device 13, and is determined by the design rule for the connection wiring 16 used for connection between the TMR device 13 and the conductive layer (not shown) on the lower side thereof. Here, for simplification, the minimum dimension of the writing word line 11, the connection wiring 16, the TMR device 13, and the bit line 12 (indicated by two-dotted chain line) is denoted by F. In addition, a connection hole 433 is formed for connection between the connection wiring 16 and the conductive layer on the lower side thereof.

The formation of the TMR device portion is conducted in two stages: a first stage for patterning and etching of the TMR device 13, and a second stage for patterning and etching of the connection wiring 16. Since both etching steps are carried out by use of a gas for metal etching, where the mask pattern 72 constituting the etching mask at the time of forming the connection wiring is staggered from the TMR device 13 by, for example, $\Delta X$ and the TMR device 13 is partly exposed, as shown in FIG. 7, the portion of the TMR device 13 exposed out of the mask pattern 72 is also etched, whereby the shape of the TMR device 13 is changed. Since the shape dispersion of the TMR devices 13 has a great influence on the device characteristics (the writing characteristic such as to change the magnetization direction), the mask pattern 72 for forming the connection wiring for the TMR device 13 must be set to a size for covering an area larger than the area of the TMR device 13, taking into account the mask alignment errors, dimensional dispersions and the like.

As a result, there has been the problem that the cell size would be large, making it impossible to raise the degree of integration. As is clear from FIG. 6, the cell size is enlarged by $\Delta X$ in the arrangement direction of the bit lines 12 and by $\Delta X \times 2$ in the arrangement direction of the writing word lines 11 which are arranged to be three-dimensionally orthogonal to the bit lines 12.

SUMMARY OF THE INVENTION

Accordingly, it is an object of the present invention to provide a method of manufacturing a magnetic memory device, and the magnetic memory device, with which it is unnecessary to secure dimensional margins for a mask pattern for forming the connection wirings 16 for the TMR devices 13 and it is possible to reduce the cell dimensions.

The present invention resides in a method of manufacturing a magnetic memory device, and the magnetic memory device, which have been made in order to attain the above object.

In accordance with one aspect of the present invention, there is provided a method of manufacturing a magnetic memory device, including the steps of: forming a first wiring; forming a tunnel magnetoresistance device which includes a tunnel insulation layer sandwiched between ferromagnetic materials and is electrically insulated from the first wiring; and forming a second wiring which is electrically connected to the tunnel magnetoresistance device and three-dimensionally intersects with the first wiring with the tunnel magnetoresistance device therebetween; wherein the method includes the steps of: forming a conductive layer for connecting the tunnel magnetoresistance device to a lower-layer wiring, after the formation of the first wiring and before the formation of the tunnel magnetoresistance device; forming a first mask having a mask shape for the tunnel magnetoresistance device on the tunnel magnetoresistance device at the time of forming the tunnel magnetoresistance device; forming a second mask to be used for forming a wiring for connecting the tunnel magnetoresistance device to the lower-layer wiring, while causing a part of the second mask to overlap with the first mask so that the first mask becomes a mask on one end side of the wiring, after the formation of the tunnel magnetoresistance device; and processing the conductive layer by use of the first mask and the second mask so as thereby to form a connection wiring for connecting the tunnel magnetoresistance device to the lower-layer wiring.

In the above-mentioned method of manufacturing a magnetic memory device, at the time of forming the connection wiring, the first mask having the mask shape for forming the tunnel magnetoresistance device is formed on the surface of the tunnel magnetoresistance device, and the second mask is formed while causing a part of the second mask to overlap with the first mask so that the first mask constitute an etching mask on one end side of the connection wiring. Therefore, even if the surface of the first mask on the tunnel magnetoresistance device is exposed to a mask alignment error of the second mask, the etching does not proceed to the lower side thereof. As a result, an end portion of the connection wiring on the side of the tunnel magnetoresistance device is formed in a self-alignment manner. Namely, at the time of forming the second mask, it is unnecessary to design allowing for an alignment margin, dimensional dispersions or the like on the tunnel magnetoresistance device side of the second mask. Therefore, it is possible to reduce the cell size, as much as it is unnecessary to allow for the alignment margin, dimensional dispersions or the like, so that it is possible to manufacture an MRAM with a degree of integration higher than those of the conventional MRAMs.

In accordance with another aspect of the present invention, there is provided a non-volatile magnetic memory device including: a first wiring, a second wiring three-dimensionally intersecting with the first wiring; and a tunnel magnetoresistance device which is electrically insulated from the first wiring, is electrically connected to the second wiring, and includes a tunnel insulation layer sandwiched between ferromagnetic materials in the region of intersection between the first wiring and the second wiring; storage of information being conducted by utilization of a change in resistance according to whether the spin directions of the ferromagnetic materials are parallel or antiparallel; wherein one end on the tunnel magnetoresistance device side of the wiring device, to be used for connecting the tunnel magnetoresistance device to a conductor on the lower side thereof is formed to have the same shape as the tunnel magnetoresistance device and to be in the state that the shape of the mask formed on the tunnel magnetoresistance device is transferred thereto.

In the above-mentioned magnetic memory device, one end portion on the tunnel magnetoresistance device side of the wiring to be used for connecting the tunnel magnetoresistance device to the conductor on the lower side thereof is formed to have the same shape as the tunnel magnetoresistance device and to be in the state that the shape of the mask formed on the tunnel magnetoresistance device is transferred thereto. Therefore, it suffices that the mask formed at the time of forming the wiring is so formed as to at least overlap with the mask shape formed on the tunnel magnetoresistance device, so that it is unnecessary to allow for an alignment margin, dimensional dispersions or the like at an end portion on the tunnel magnetoresistance device side of the wiring to be formed. Therefore, the cell area can be reduced, as much as the alignment margin, the dimensional dispersions and the like. Accordingly, it is possible to provide an MRAM with a degree of integration higher than those of the conventional MRAMs. Incidentally, the alignment margin arises principally from the alignment margin of an exposure apparatus and etching accuracy.

The above and other objects, features and advantages of the present invention will become apparent from the following description and appended claims, taken in conjunction with the accompanying drawings which show by way of example some preferred embodiments of the invention.

BRIEF DESCRIPTION OF THE DRAWINGS

FIGS. 4A and 4B are manufacturing step sectional views for illustrating the method of manufacturing a magnetic memory device according to the related art;

DETAILED DESCRIPTION OF THE PREFERRED EMBODIMENTS

Now, one embodiment of the method of manufacturing a magnetic memory device according to the present invention will be described referring to the manufacturing step sectional views shown in FIGS. 1 and 2.

Figure 1A:
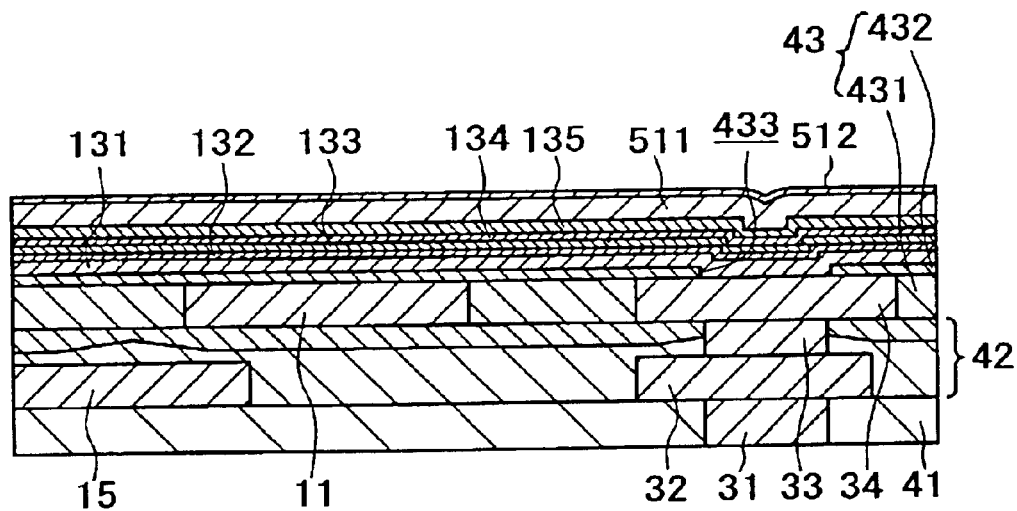
FIGS. 1A to 1C are manufacturing step sectional views for illustrating one embodiment of a method of manufacturing a magnetic memory device according to the present invention.

As shown in FIG. 1A, a first insulation film 41 for covering a reading transistor (not shown) is formed, and a first contact 31 to be connected to a diffusion layer (not shown) of the reading transistor is formed in the first insulation film 41. Further, a sense line 15, a first landing pad 32 connected to the first contact 31, and the like are formed on the first insulation film 41, and a second insulation film 42 for covering these is formed. In forming the second insulation film 42, a P-TEOS (tetraethoxysilane) film is formed in a thickness of, for example, 100 nm by, for example, a plasma TEOS-CVD method, then an HDP film is formed in a thickness of 800 nm by a high density plasma CVD (chemical vapor deposition) method, and, further, a P-TEOS film is formed in a thickness of, for example, 1200 nm by a plasma TEOS-CVD method. Thereafter, the second insulation film 42 is polished and planarized by chemical mechanical polishing, and the second insulation film 42 is left in a thickness of, for example, 700 nm on the sense line (not shown), the first landing pad (not shown) and the like. Furthermore, a mask layer (not shown) composed of P-SiN film is built up in a thickness of, for example, 20 nm by a plasma CVD method.

Next, a via hole (not shown) is formed in the mask layer on the sense line 15 and the first landing pad 32 by use of lithographic technique and etching technique. Subsequently, an insulation film 431 constituting a lower layer of a third insulation film is formed on the mask layer. As the insulation film 431, a P-TEOS film built up in a thickness of, for example 500 nm is used. Next, a writing word line (first wiring) 11 with a groove wiring structure is formed in the insulation film 431, by use of a known groove wiring technique, and a second contact 33 and a second landing pad 34 which are connected to the first landing pad 32 are formed. The writing word line 11, the second contact 33 and the second landing pad 34 are formed as follows. For example by sputtering, a titanium (Ti) film is formed in a thickness of 10 nm, then a titanium nitride (TiN) film is formed in a thickness of 30 nm, and an Al-0.5% Cu alloy is built up in a thickness of 700 nm. Thereafter, chemical mechanical polishing is conducted to remove an excess of the metallic layers on the insulation film 431.

Subsequently, by sputtering, an insulation film 432 for covering the writing word line 11 is formed on the insulation film 431 by, for example, building up aluminum oxide in a thickness of 50 nm. Thus, a third insulation film 43 is composed of the insulation film 431 and the insulation film 432. The insulation film 432 may also be formed of other insulating material than aluminum oxide (for example, silicon oxide, silicon nitride, etc.).

Next, the insulation film 432 is etched with a photoresist (not shown) as a mask, by lithographic technique and etching technique, to provide the insulation film 432 on the second landing pad 34 with a connection hole 433 for connection between a TMR device to be formed and the second landing pad 34.

Subsequently, a barrier layer (not shown), an antiferromagnetic material layer 131, a magnetization fixed layer 132 formed of a ferromagnetic material, a tunnel insulation layer 133, a storage layer 134 formed of a ferromagnetic material, and a cap layer 135 are sequentially formed in this order from the lower side, on the third insulation film 43 inclusive of the connection hole 43, by PVD (physical vapor deposition).

As the barrier layer, for example, titanium nitride, tantalum or tantalum nitride is used.

For forming the antiferromagnetic material layer 131, for example, one selected from the group consisting of iron-manganese alloys, nickel-manganese alloys, platinum-manganese alloys, iridium-manganese alloys, rhodium-manganese alloys, cobalt oxide and nickel oxide is used. The antiferromagnetic material layer 131 can function also as a conductive layer to be used for connection between the TMR device 13 and a switching device connected in series thereto. Therefore, in the present embodiment, the antiferromagnetic material layer 131 is used as a part of a connection wiring for connection between the TMR device 13 and the switching device (not shown).

As the magnetization fixed layer 132, a ferromagnetic material consisting of, for example, nickel, iron or cobalt, or an alloy material consisting of at least two metals of nickel, iron and cobalt is used. The magnetization fixed layer 132 is formed in the state of making contact with the antiferromagnetic material layer 131, and due to an exchange interaction between the magnetization fixed layer 132 and the antiferromagnetic material layer 131, the magnetization fixed layer 132 has a strong unidirectional magnetic anisotropy. Namely, pinning of the magnetization direction of the magnetization fixed layer 132 results from the exchange coupling between the magnetization fixed layer 132 and the antiferromagnetic material layer 131.

Incidentally, the magnetization fixed layer 132 may have a structure in which a conductive layer is sandwiched between magnetic layers. For example, a first magnetization fixed layer, a conductor layer to be antiferromagnetically connected with a magnetic layer, and a second magnetization fixed layer may be sequentially laminated in this order from the side of the antiferromagnetic material layer 131. The magnetization fixed layer 132 may have a structure in which at least three ferromagnetic material layers are laminated, with a conductor layer therebetween. As the conductor layer, for example, ruthenium, copper, chromium, gold, silver and the like may be used.

The tunnel insulation layer 133 has the functions of disconnecting the magnetic coupling between the storage layer 134 and the magnetization fixed layer 132 and permitting a tunnel current to flow. Therefore, generally, aluminum oxide in a thickness of 0.5 to 5 nm is used as the tunnel insulation layer 133; however, for example, magnesium oxide, silicon oxide, aluminum nitride, magnesium nitride, silicon nitride, aluminum oxynitride, magnesium oxynitride or silicon oxynitride may also be used. Since the tunnel insulation layer 133 has a very small thickness of 0.5 to 5 nm, the layer is formed by an ALD (atomic layer deposition) method. Alternately, the tunnel insulation layer 133 is formed by building up a metallic film such as aluminum by sputtering and then subjecting the metallic film to plasma oxidation or nitriding.

As the storage layer 134, a ferromagnetic material consisting of, for example, nickel, iron or cobalt, or an alloy material consisting of at least two metals of nickel, iron and cobalt is used. The storage layer 134 has such a property that its magnetization direction can be changed to parallel or antiparallel, relative to the magnetization fixed layer 132, according to an externally applied magnetic field.

The cap layer 135 has the functions of preventing mutual diffusion between the TMR device and the wiring for connection to other TMR devices, reducing the contact resistance, and preventing the oxidation of the storage layer 134. Generally, the cap layer 135 is formed of such a material as copper, tantalum nitride, tantalum, and titanium nitride.

Further, a conductive layer 511 for forming a first mask is formed on the cap layer 135 by building up, for example, tantalum or tantalum nitride in a thickness of, for example, 50 nm by, for example, a CVD method. Next, an etching mask layer 512 is formed by building up a plasma CVD oxide film or plasma CVD silicon nitride in a thickness of, for example, 50 nm by, for example, sputtering. The conductive layer 511 may be formed by use of such a conductor as tungsten and tungsten nitride in place of tantalum or tantalum nitride.

Figure 1B:
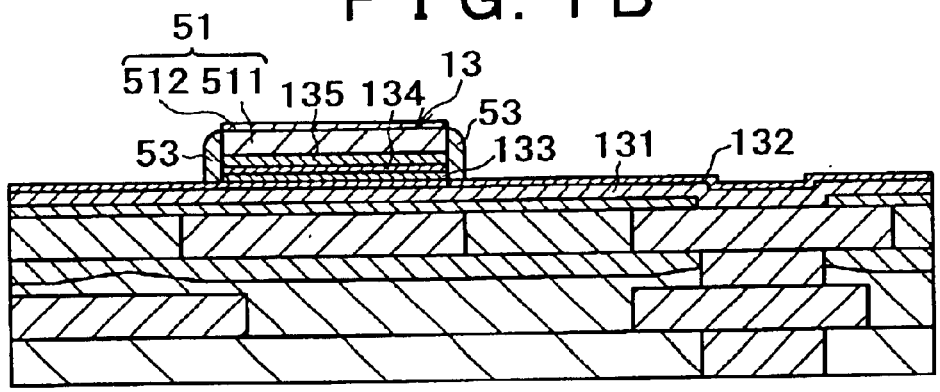

Next, as shown in FIG. 1B, by lithographic technique and etching (for example, reactive iron etching) technique, with a photoresist as a mask (not shown), a laminate film (etching mask layer 512 to antiferromagnetic material layer 131) for forming the first mask and the TMR device 13 is etched (reactive ion etching), the etching mask layer 512 is first etched, and then the conductive layer 511 is etched, to form the first mask 51.

Further, the cap layer 135 is etched. Thereafter, the above-mentioned photoresist is removed. Then, with the first mask 51 as an etching mask, the laminate film ranging from the storage layer 134 to the magnetixation fixed layer 132 is etched, to form the TMR device 13. In this etching, the finish point is so set that the etching is finished at an intermediate point in the range from the tunnel insulation layer 133 to the antiferromagnetic material layer 131. Here, as an example, the finish point of etching is set at an intermediate point of the tunnel insulation layer 133. As the etching gas, a halogen gas containing chlorine (Cl) or bromine (Br) (for example, $Cl_2$, $BCl_3$, HBr, etc.) or a mixed gas prepared by adding ammonia ($NH_3$) to carbon monoxide (CO) is used.

Incidentally, the removal of the photoresist may be conducted after the etching mask layer 512 is processed, or after the first mask 51 is processed. In this case, at the time of etching the cap layer 135, the etching mask 512 of the first mask 51 is etched. With such an operation, since the tunnel insulation layer 133 is covered with the storage layer 134, even if oxygen is generated upon removal of the resist, it is possible to obviate the problem that the ferromagnetic material layer at the interface of the tunnel insulation layer 133 might be oxidized with the result that the tunnel insulation layer 133 is formed to be thicker.

Next, a plasma silicon nitride film as a film for forming a side wall is built up on the whole surface by a plasma CVD method, in the condition of covering the TMR device 13. Alternately, an aluminum oxide film is built up on the whole surface by sputtering. Then, the built-up film is etched back to leave the film on side surfaces of the TMR device 13, thereby forming the side wall 53.

Figure 1C:
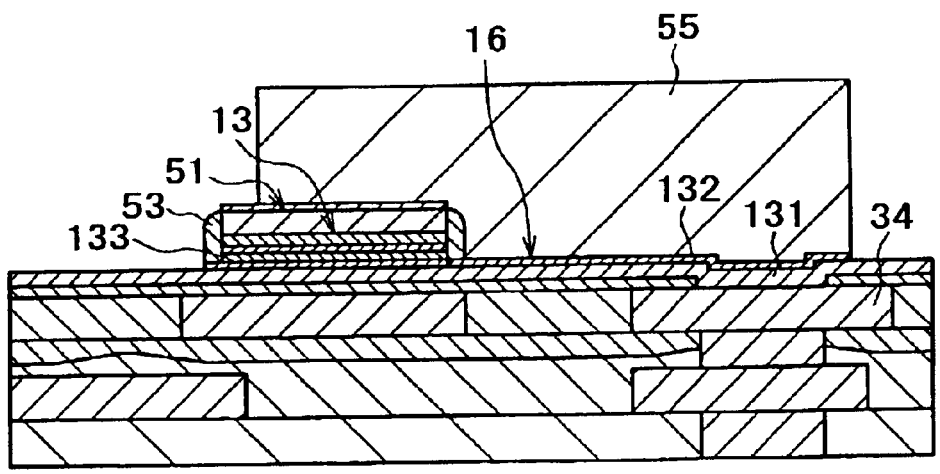

Subsequently, as shown in FIG. 1C, a second mask 55 to be used for forming a connection wiring for connection between the TMR device 13 and the second landing pad 34 is formed. The second mask 55 is formed, for example, of a resist by lithographic technique, in the manner of causing at least a part of the second mask 55 to overlap with the first mask 51 on the TMR device 13 so that the TMR device 13 becomes an etching mask on one end side of the connection wiring. In this case, there arises no trouble even if the second mask 55 is formed to be staggered from the desired position and a part of the first mask 51 is exposed. In addition, the first mask 51 may be entirely covered with the second mask 55. In the drawing, there is shown the condition where a part of the first mask 51 is exposed.

Thereafter, by an etching (for example, reactive ion etching) technique using the second mask 55 and the first mask 51, the connection wiring 16 for connection between the TMR device 13 and the second landing pad 34 is formed by utilization of, for example, the antiferromagnetic material layer 131 and the magnetization fixed layer 132 which constitute a conductive layer. Therefore, in the present embodiment, the conductive layer for forming the connection wiring 16 consists of the antiferromagnetic material layer 131 and the magnetization fixed layer 132.

Incidentally, the connection wiring 16 may also be formed by utilizing only the antiferromagnetic material layer 131 as the conductive layer. In addition, there may be adopted a structure in which a metallic layer (not shown) formed of, for example, ruthenium, copper, chromium, gold, silver or the like is preliminarily formed as an undercoat for the antiferromagnetic material layer 131, and the metallic layer and the antiferromagnetic material layer 131, or these layers and the magnetization fixed layer 132, are utilized to constitute the conductive layer, thereby forming the connection wiring 16. Thereafter, the second mask 55 is removed by a known resist removing technique. In this case, since the TMR device 13 is covered with the first mask 51 and the insulation film side wall 53, it is possible to obviate the problem that the ferromagnetic material films on the upper and lower sides of the tunnel insulation film 133 are oxidized to add to the thickness of the tunnel insulation layer 133, even if oxygen is generated at the time of removal of the resist.

Figure 2A:
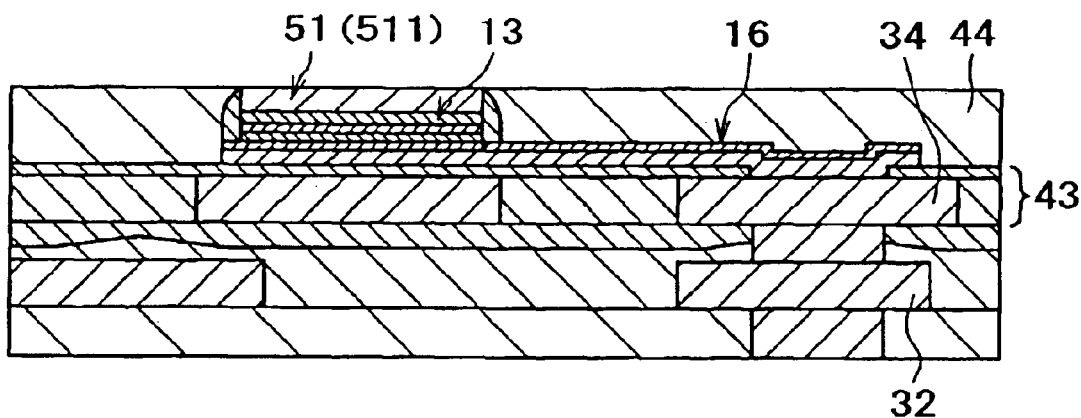
FIGS. 2A and 2B are manufacturing step sectional views for illustrating the embodiment of the method of manufacturing a magnetic memory device according to the present invention.

Next, as shown in FIG. 2A, a fourth insulation film 44 for covering the TMR device 13, the connection wiring 16 and the like is formed on the third insulation film 43. The fourth insulation film 44 is formed by building up silicon oxide or aluminum oxide or the like in a thickness of, for example, 200 nm by, for example, a CVD method or a PVD method. Thereafter, the surface of the fourth insulation film 44 is planarized by chemical mechanical polishing (CMP), to expose the upper surface of the first mask 51 on the TMR device 13. Here, the etching mask layer 512 (see FIG. 1B) of the first mask 51 was removed, and polishing was conducted so as to expose the upper surface of the conductive layer 511. Where the etching mask layer 512 is formed of plasma CVD silicon nitride, after the surface thereof is exposed by the polishing, the etching mask layer 512 may be selectively removed by etching conditions with a high selectivity ratio relative to the fourth insulation film 44, for example, by use of $CF_4$ or $SF_6$. In addition, there may be adopted the condition where the upper surface of the etching mask layer 512 formed of titanium nitride or tantalum nitride is exposed by CMP.

Besides, connection holes (not shown) for connection to lower-layer metallic layers (for example, the same layer as the first landing pad 32, the same layer as the second landing pad 34) of peripheral circuits are also formed by an ordinary lithographic technique and etching.

Figure 2B:
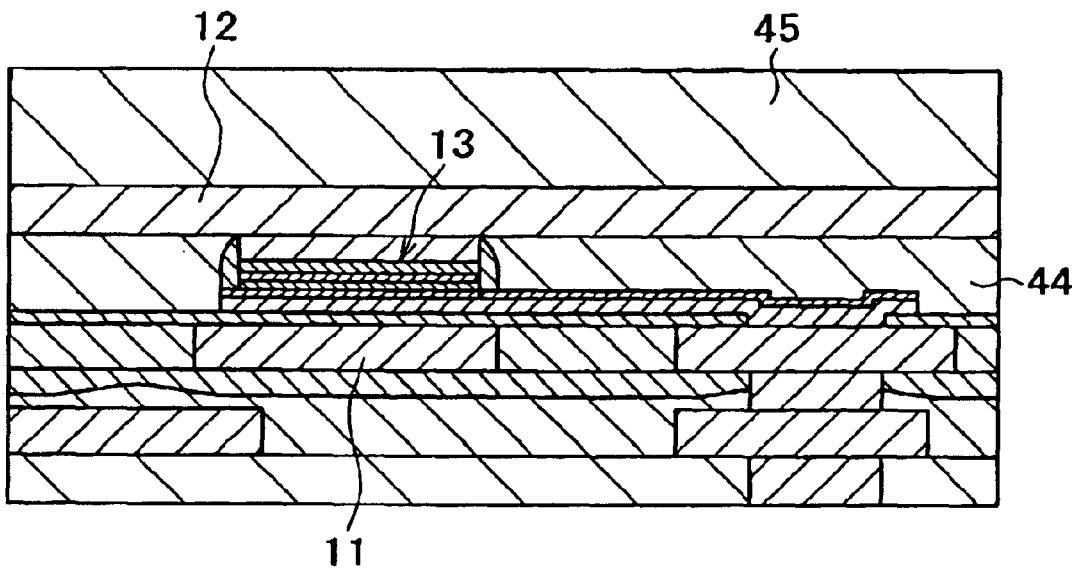
Figure 3A:
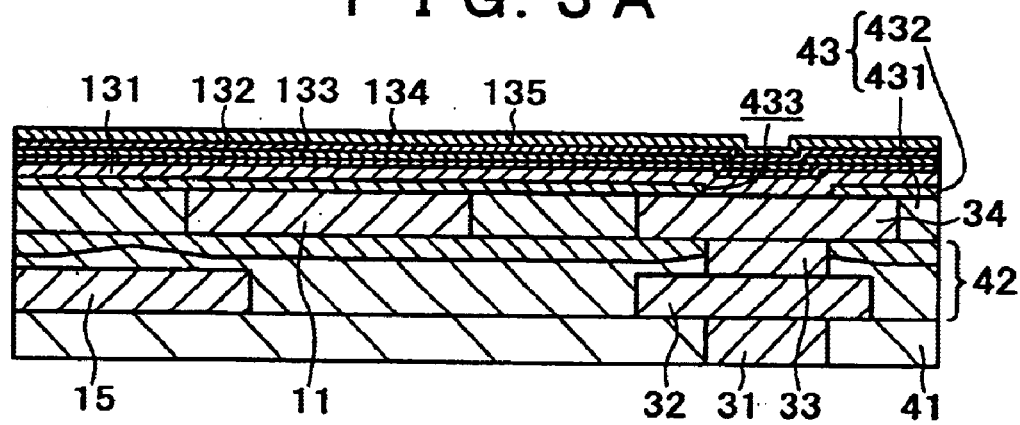
FIGS. 3A to 3C are manufacturing step sectional views for illustrating a method of manufacturing a magnetic memory device according to the related art.
Figure 3B:
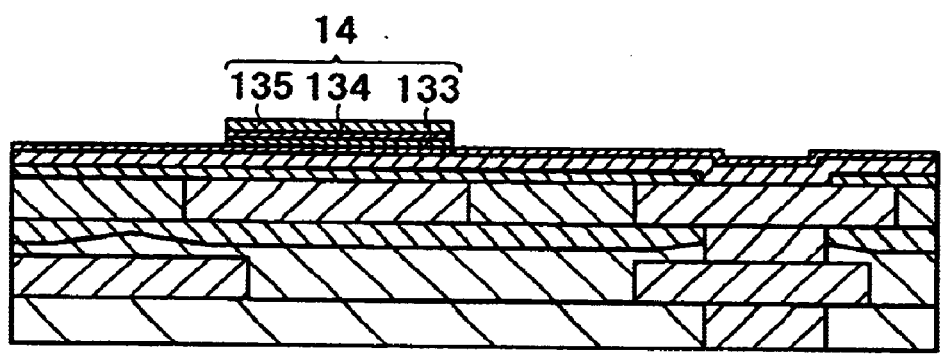
Figure 3C:
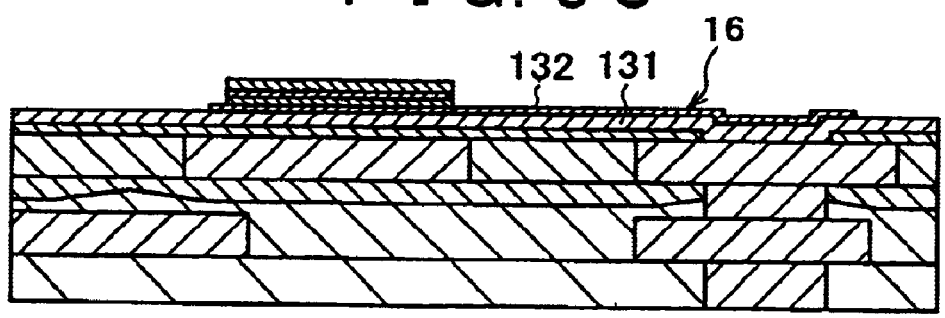
Figure 5:
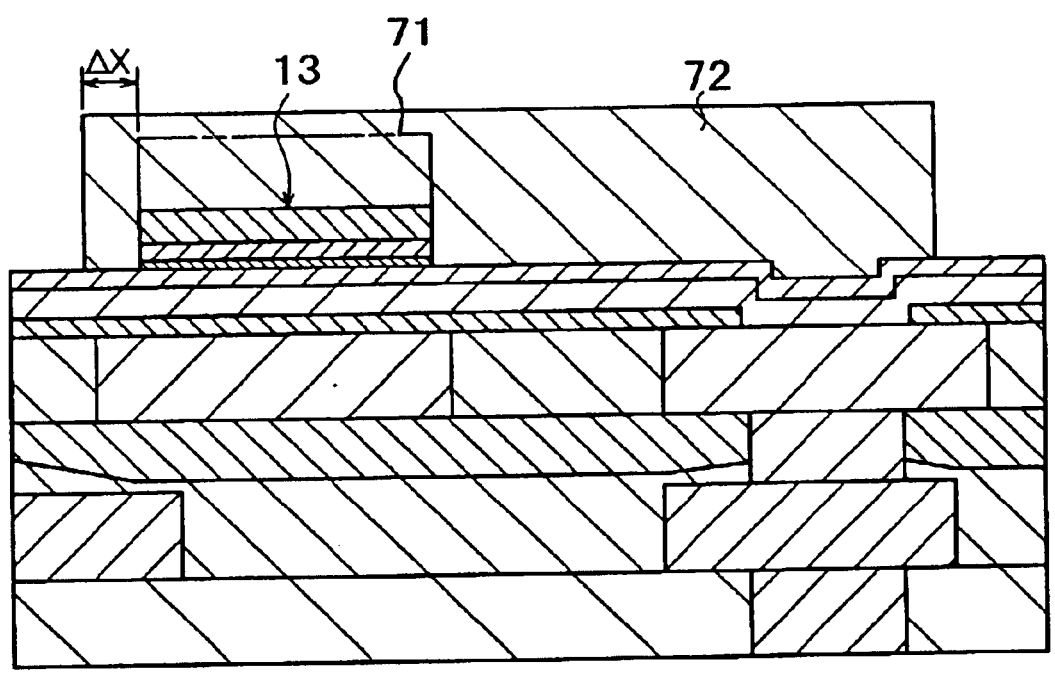
FIG. 5 is a general constitutional sectional view for illustrating an alignment error of a mask pattern.
Figure 6:
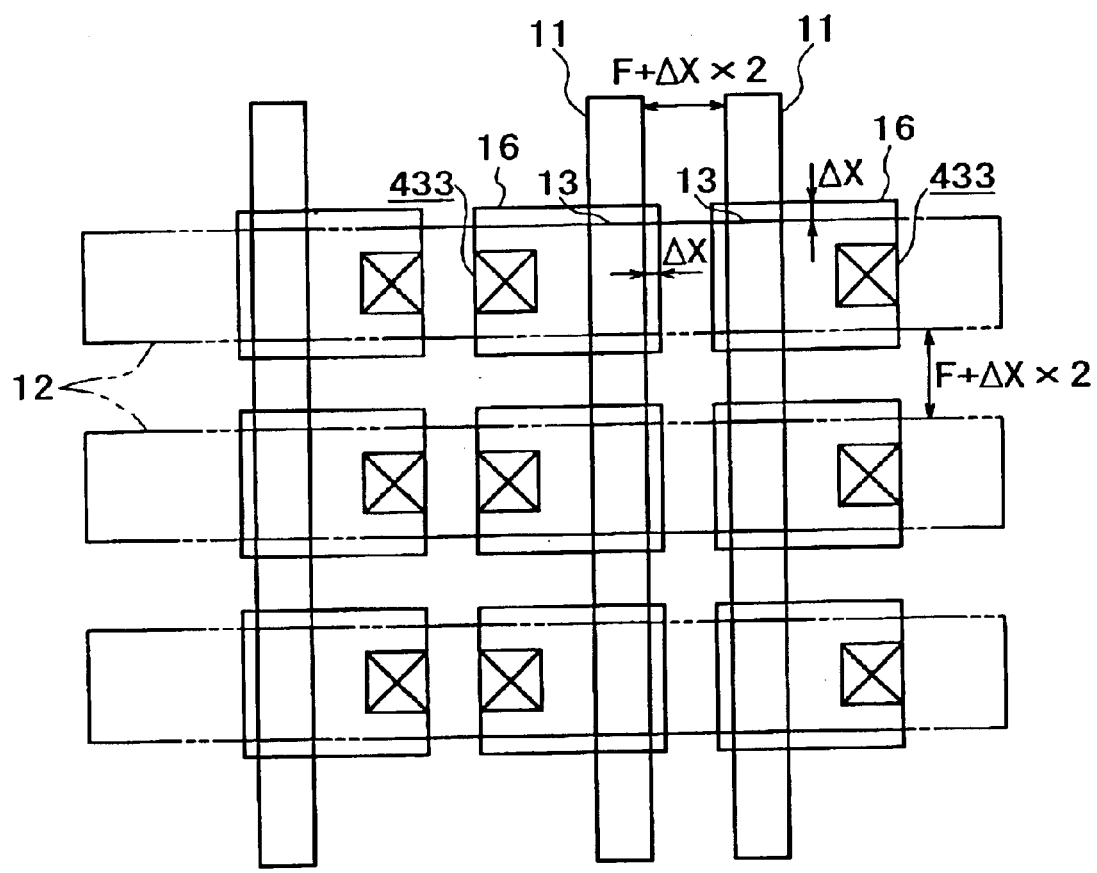
FIG. 6 is a layout view for illustrating the alignment margin of connection wirings for TMR devices.
Figure 7:
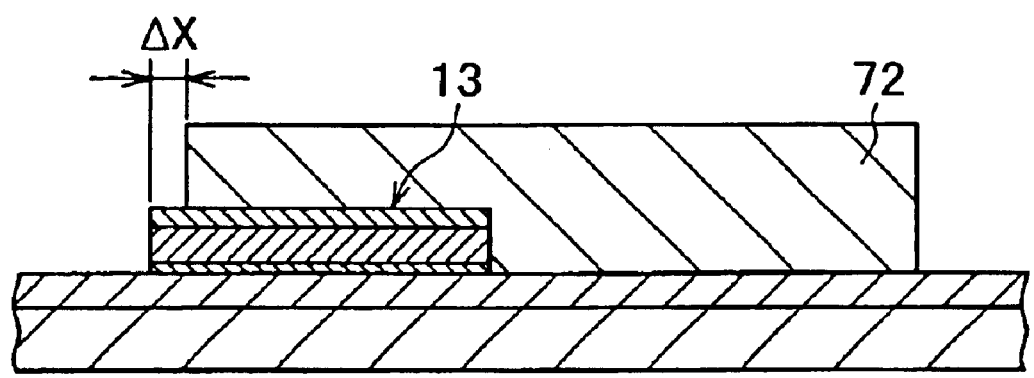
FIG. 7 is a general constitutional sectional view for illustrating the problem due to an alignment error in a mask pattern to be used at the time of forming a connection wiring.

Subsequently, as shown in FIG. 2B, a bit line (second wiring) 12, wirings (not shown) of the peripheral circuits, and bonding pad regions (not shown) are formed by a generally known wiring forming technique. The bit line 12 is electrically connected to the tunnel magnetoresistance device 13, and is so formed as to three-dimensionally intersect with the writing word line 11 with the tunnel magnetoresistance device 13 therebetween. Further, a fifth insulation film 45 to be a protective layer is formed on the whole area by building up, for example, a plasma silicon nitride film, and bonding pad portions are opened, to complete the wafer process for the magnetic memory device.

As has been described in the above embodiment, the first mask 51 can be used for the contact for connection between the TMR device 13 and the bit line 12 which will be formed later. On the other hand, the first mask 51 may be composed of an oxide film or a nitride film, and may be used as a part of the fourth insulation film 44. In this case, it is necessary to provide a connection hole for connection between the bit line 12 and the TMR device 13. Alternatively, the first mask 51 may be removed after the formation of the connection wiring 16. In this case, it is possible to form the bit line 12 closer to the TMR device 13 than in the above embodiment, and writing through the bit lines 12 is further facilitated.

In the above-described manufacturing method, at the time of forming the connection wiring 16, the first mask 51 is formed on the surface of the TMR device 13, the insulation film side wall 53 is formed on the side walls of the TMR device 13, and the TMR device 13 is covered with these films. Therefore, even if the surface of the first mask 51 on the TMR device 13 is exposed due to an alignment error of the second mask 55, the etching is stopped by the first mask 51 and does not proceed more. As a result, the end portion of the connection wiring 16 on the side of the TMR device 13 is formed in the manner of the so-called self-alignment.

Namely, it is unnecessary to design the cell while allowing for an alignment margin on the TMR device 13 side of the second mask 55 which is formed for forming the connection wiring 16. Accordingly, the cell size can be reduced, as much as it is unnecessary to allow for the alignment margin.

In addition, while the insulation film side wall 53 has been formed on side surfaces of the TMR device 13 in the above embodiment, for the purpose of forming the connection wire 16 in the manner of self-alignment, the insulation film side wall 53 may be omitted. The insulation film side wall 53 has the effect of not exposing the side walls of the TMR device 13 to the oxidative atmosphere at the time of forming the fourth insulation film 44 which is to be an inter-layer film. Namely, it obviates the problem that, of the TMR device 13, the magnetization fixed layer 132 and the storage layer 134 formed of a ferromagnetic material on the upper and lower sides of the tunnel insulation layer 133 might be oxidized with the result of an increase in the film thickness of the tunnel insulation layer 133 which is formed with a very small film thickness of 0.5 to 5 nm. Therefore, the film thickness of the tunnel insulation layer 133 is not changed, even locally.

According to the method of manufacturing a magnetic memory device as described above, a magnetic memory device 1 as shown in FIG. 2B is constituted. In this magnetic memory device 1, the connection wiring 16 to be used for connecting the tunnel magnetoresistance device 13 to the conductor on the lower side thereof, for example, the diffusion layer (not shown) of the reading transistor through the first and second contacts 31 and 33, the first and second landing pads 32 and 34, and the like has its end portion on the TMR device 13 side formed in the same shape as the TMR device 13 and in the state that the shape of the first mask 51 formed on the TMR device 13 is transferred thereto. Accordingly, it suffices that the second mask 55 formed at the time of forming the connection wiring 16 is so formed as to at least overlap with the shape of the first mask 51 formed on the TMR device 13. As a result, it is unnecessary to design the cell while allowing for the alignment margin at the end portion on the TMR device 13 side of the connection wiring 16. Therefore, the cell area can be reduced, as much as the alignment margin. The alignment margin arises principally from the alignment margin of the exposure apparatus and etching accuracy.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of manufacturing a magnetic memory device, comprising the steps of:

forming a first wiring;

forming a tunnel magnetoresistance device which comprises a tunnel insulation layer sandwiched between ferromagnetic materials and electrically insulated from said first wiring; and forming a second wiring electrically connected to said tunnel magnetoresistance device;

wherein said method comprises the steps of:

forming a conductive layer for connecting said tunnel magnetoresistance device to a lower-layer wiring, after the formation of said first wiring and before the formation of said tunnel magnetoresistance device;

forming a first mask to be used for forming said tunnel magnetoresistance device;

after the formation of said magnetoresistive device, forming a second mask to be used for forming a wiring for connecting said tunnel magnetoresistance device to the lower-layer wiring, said second mask partly or entirely overlapping said first mask; and processing said conductive layer by use of said first mask and said second mask so as thereby form a connection wiring for connecting said tunnel magnetoresistance device to the lower-layer wiring.

2. A method of manufacturing a magnetic memory device as set forth in claim 1, comprising the step of:

forming insulation film side walls on sides of said tunnel magnetoresistive device to be a mask at the time of processing said conductive layer.

* * * * *